United States Patent
Di Stefano

(10) Patent No.: US 9,346,151 B2
(45) Date of Patent: May 24, 2016

(54) PRECISION CARRIER FOR MICROELECTRONIC DEVICES

(75) Inventor: Thomas H. Di Stefano, Monte Sereno, CA (US)

(73) Assignee: Centipede Systems, Inc., Santa Clara, CA (US)

(*) Notice: Subject to any disclaimer, the term of this patent is extended or adjusted under 35 U.S.C. 154(b) by 1204 days.

(21) Appl. No.: 13/311,835

(22) Filed: Dec. 6, 2011

(65) Prior Publication Data

US 2012/0139176 A1 Jun. 7, 2012

Related U.S. Application Data

(60) Provisional application No. 61/420,739, filed on Dec. 7, 2010.

(51) Int. Cl.
  *B25B 5/14* (2006.01)
  *B25B 5/06* (2006.01)
  *H01L 21/673* (2006.01)

(52) U.S. Cl.
  CPC . *B25B 5/142* (2013.01); *B25B 5/06* (2013.01); *H01L 21/67333* (2013.01); *Y10T 29/49998* (2015.01)

(58) Field of Classification Search
  CPC .. H01R 43/20; H01R 43/205; H05K 13/0061; H05K 13/0069
  See application file for complete search history.

(56) References Cited

U.S. PATENT DOCUMENTS

| | | |
|---|---|---|
| 4,345,810 A | 8/1982 | Bakermans |
| 4,881,639 A | 11/1989 | Matsuoka et al. |
| 5,140,405 A | 8/1992 | King et al. |
| 5,161,983 A | 11/1992 | Ohno et al. |
| 5,221,209 A | 6/1993 | D'Amico |
| 5,344,334 A | 9/1994 | Laub et al. |
| 5,494,169 A | 2/1996 | Matsuoka |
| 5,501,436 A * | 3/1996 | Miller ............... H05K 13/0069 269/254 CS |
| 5,518,410 A | 5/1996 | Masini |
| 5,713,744 A | 2/1998 | Laub |
| 5,758,776 A | 6/1998 | Slocum et al. |
| 5,781,021 A | 7/1998 | Ilani |
| 5,785,307 A * | 7/1998 | Chung ............... H05K 13/0069 269/254 CS |
| 5,801,452 A | 9/1998 | Farnesworth et al. |
| 5,957,293 A | 9/1999 | Pakeriasamy |
| 6,132,220 A | 10/2000 | McHugh et al. |
| 6,179,127 B1 | 1/2001 | Kato et al. |
| 6,196,849 B1 | 3/2001 | Goodwin |
| 6,227,372 B1 | 5/2001 | Thomas et al. |
| 6,242,933 B1 | 6/2001 | Yap |
| 6,377,062 B1 | 4/2002 | Ramos et al. |
| 6,474,477 B1 | 11/2002 | Chang |
| 6,535,007 B2 | 3/2003 | Haas et al. |
| 6,627,483 B2 | 9/2003 | Ondricek et al. |
| 6,644,981 B2 | 11/2003 | Choy |
| 6,696,849 B2 | 2/2004 | Ban et al. |
| 6,699,047 B1 | 3/2004 | McHugh et al. |

(Continued)

FOREIGN PATENT DOCUMENTS

| | | |
|---|---|---|
| EP | 0220600 A2 | 5/1987 |
| WO | 2009/100910 A1 | 8/2009 |

*Primary Examiner* — Lee D Wilson
(74) *Attorney, Agent, or Firm* — Michael B. Einschlag

(57) ABSTRACT

A carrier for one or more microelectronic devices, for example and without limitation, bare semiconductor chips, that are releasably held on their edges in apertures in a planar body. A device may be released from an aperture by resilient distortion of the aperture in the plane of the planar body.

12 Claims, 4 Drawing Sheets

(56) References Cited

U.S. PATENT DOCUMENTS

| | | |
|---|---|---|
| 6,762,611 B2 | 7/2004 | Hubner et al. |
| 6,848,936 B2 | 2/2005 | DeFord |
| 6,864,568 B2 | 3/2005 | Kohno et al. |
| 6,877,993 B2 | 4/2005 | Palaniappa et al. |
| 6,929,505 B2 | 8/2005 | He et al. |
| 7,118,385 B1 * | 10/2006 | Bodenweber ........ H05K 7/1061 439/374 |
| D589,010 S | 3/2009 | Di Stefano |
| D589,011 S | 3/2009 | Di Stefano |
| 7,510,402 B2 * | 3/2009 | Ma ..................... H01R 13/2435 439/66 |
| 8,683,674 B2 * | 4/2014 | Di Stefano ......... G01R 31/2867 29/596 |
| 2002/0057963 A1 | 5/2002 | Peterson et al. |
| 2004/0155646 A1 | 8/2004 | Hoppe |
| 2005/0196982 A1 * | 9/2005 | Cao ..................... H01R 12/7076 439/70 |
| 2006/0071656 A1 | 4/2006 | Joung et al. |
| 2008/0252330 A1 | 10/2008 | Hart et al. |
| 2010/0206768 A1 | 8/2010 | Hoffmann et al. |

* cited by examiner

PRECISION CARRIER FOR MICROELECTRONIC DEVICES

This patent application relates to U.S. Provisional Application No. 61/420,739 filed Dec. 7, 2010 from which priority is claimed under 35 USC §119(e), and which provisional application is incorporated herein in its entirety.

CROSS-REFERENCE TO RELATED APPLICATIONS

This application is related to the following applications which are owned by the assignee of this application: (a) a related application entitled "Method and Apparatus for Holding Microelectronic Devices," which related application has application Ser. No. 12/535,519 and was filed on Aug. 4, 2010; and (b) a related application entitled "Method for Stacking Microelectronic Devices," which related application was filed the same day this application was filed.

TECHNICAL FIELD

One or more embodiments of the present invention relate to releasably holding devices such as, for example and without limitation, bare semiconductor chips, in a precision carrier to enable registration of one or more devices held in the carrier.

BACKGROUND

Semiconductor processing is an increasingly complex and mature technology for which the cost of test and burn-in consumes an ever larger share of production costs. Continuous progress is being made in semiconductor technology and wafer fabrication efficiency, such progress being characterized by Moore's law which has successfully predicted a doubling of the number of devices on a semiconductor chip every two years. Productivity gains from advances in semiconductor technology and wafer fabrication efficiency underlie the modern economy, making possible mobile electronics, internet communications and much of modern life. However, semiconductor packaging and testing have not maintained the same pace of technological progress.

Methods commonly used for contacting individual, separated semiconductor chips during testing have remained largely the same for decades. For example, after wafer probe testing, a wafer is sawn apart into individual chips. Additional packaging steps may be used to protect the chip and facilitate its attachment into an electronic system. After packaging, each chip is inserted into a first socket to test for opens and shorts before burn-in. Each chip is then released from the first socket and transported in a tray. In an optional next step, the chip is inserted into a second (burn-in) socket and burned-in for eight hours at an elevated temperature of about 125° C. After burn-in, the chip is removed from the burn-in socket and transported in a tray to "final test" where it is inserted into a third socket. A comprehensive set of tests is done in final test, which tests are typically done at several speeds and temperatures. The socketing, sockets, fixtures, test boards and handling involved with the process of testing individual chips and other microelectronic devices is an increasing problem in streamlining the production of semiconductor devices.

Attempts have been made to eliminate the need for individual sockets in test and burn-in, with limited success in certain segments of the industry. For example, wafer probe testing using full wafer contactors has been used to burn-in and test all chips on a wafer in parallel, simultaneously. In DRAM and FLASH memory production, wafer probe testing is now being done in parallel for each chip on a wafer. However, at present, cost and performance limitations prevent the practical use of full wafer contactors to burn-in and performance test all chips on a wafer. In particular, for more complex chips such as microprocessors, signal processors, ASICS and communications chips, the high I/O count, power and performance associated with these complex chips prevent use of full wafer contactors for anything other than simple wafer probe testing at best. Although considerable resources, including work in university, U.S. government and industrial laboratories, have been devoted to full wafer burn-in and speed testing, the problem of finding a practical solution remains unsolved.

Other attempts to test and burn-in devices have been made which entail contacting a strip of partially packaged chips. In the process of packaging semiconductor chips as chip scale packages (CSPs) or ball grid arrays (BGAs), an array of chips is held together in a strip format. An array contactor is then used to test and burn-in arrays of chips in the strip format by having the array contactor contact terminals on each partially packaged chip without using a single chip socket. After testing, the process of packaging the chips is completed, and the strip is sawn into individual finished devices. While testing in a strip format eliminates the need for individual costly sockets for some electrical tests, strip testing is only applicable to packages that are processed in strip format. A further limitation results from a complication of the process flow wherein devices leave a packaging area to be tested in a test facility, and then return to packaging for finishing and singulation into individual devices.

Another approach involves placing chips, whether packaged or not, in an accurately positioned array on a carrier. To provide accurate placement of chips on the carrier (accurate placement is needed for registering terminals on the chips to mating contactors), each chip must be loaded onto the carrier precisely. Accurate registration ensures that pads of a device reliably and repeatedly contact corresponding pads of the tester. Mis-registration of the chip is only detected at a testing station when electrical signals are applied to the chip. However, registration is addressed in the art by testing the chip or chips on a carrier immediately after placement of each chip on the carrier. This approach has a limitation in that chips on a carrier cannot be transported through the process from test for opens and shorts, to burn-in, and then to final test while maintaining registration.

SUMMARY

One or more embodiments of the invention resolve one or more of the above-identified issues. In particular, one embodiment is a precision carrier for one or more microelectronic devices, for example and without limitation, bare semiconductor chips, that are releasably held on their edges in apertures in a planar body, for example and without limitation, a resilient sheet. In accordance with one or more such embodiments, a device may be released from the precision carrier by a resilient distortion of an aperture in the plane of the planar body.

DETAILED DESCRIPTION

In accordance with one or more embodiments, a carrier (also referred to herein as a tray) is provided for releasably holding devices, for example and without limitation, microelectronic devices, in place so that the devices may be moved to a socket, for example and without limitation, a test socket, and so that the devices may be aligned with mating contactors, for example and without limitation, test contactors (for example, an electrode terminal of a socket), in the socket, for example and without limitation, the test socket.

As used herein, the term device is used in the broadest sense and includes, without limitation, an electronic device and a microelectronic device including a semiconductor chip, a flip chip, a packaged electronic circuit, a hybrid circuit, a daughter card, a multi-chip module, and the like. As further non-limiting examples of the types of microelectronic devices which may be held in a carrier fabricated in accordance with one or more embodiments are BGAs (as used herein the term BGA, or ball grid array, is a two dimensional array of solder bump terminals on a microelectronic device), CSPs (as used herein, the term CSP is a chip scale package), flip-chips, wafer level packages (WLPs), bare semiconductor dice, MEMS, and multi-chip modules.

Figure 1A:
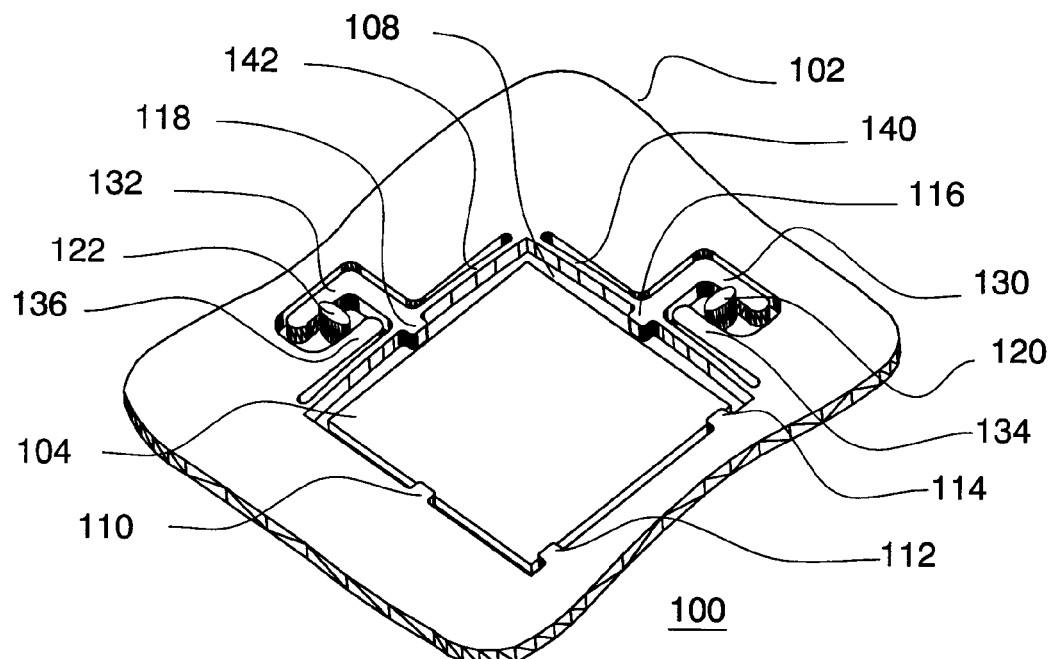
FIGS. 1A and 1B are perspective views of a site in a carrier for holding microelectronic devices that is fabricated in accordance with one or more embodiments, the site being shown in an open and in a closed configuration, respectively.
Figure 1B:
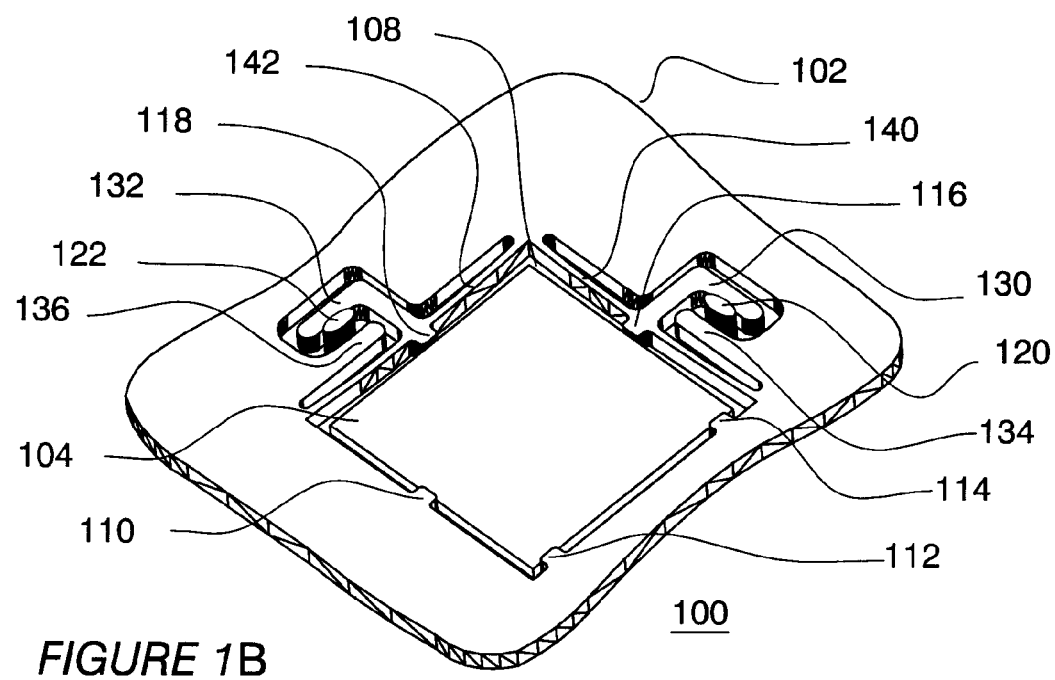
Figure 3A:
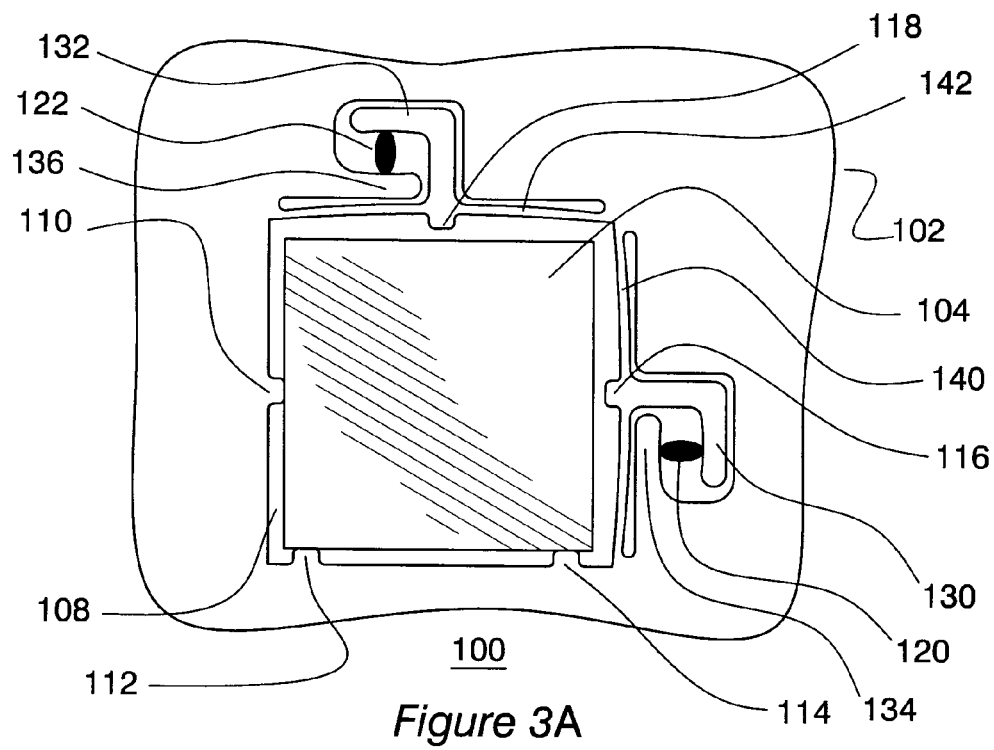
FIG. 3A and 3B are top views of the site in the carrier for holding microelectronic devices shown in FIGS. 1A and 1B, the site being shown in an open and in a closed configuration, respectively.
Figure 3B:
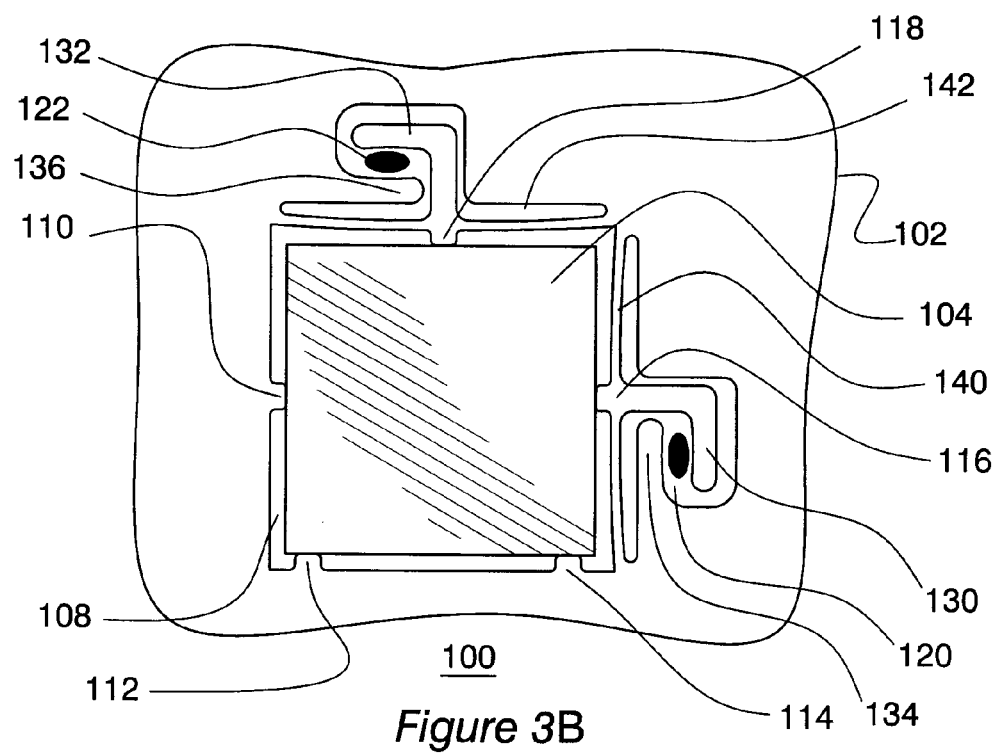

In accordance with one or more embodiments, a carrier comprises one or more sites that include resilient apertures, which sites are arrayed in a planar body. As used herein, a site includes an aperture within a carrier for one device. FIGS. 1A and 1B are perspective views of site 100 in a carrier for holding a microelectronic device that is fabricated in accordance with one or more embodiments, site 100 being shown in an open and in a closed configuration, respectively; and FIGS. 3A and 3B are top views of site 100 shown in an open and in a closed configuration, respectively. As used herein, the expression "respectively" means that a first item in a first list relates to a first item in a second list; a second item in the first list relates to a second item in the second list; and so forth.

As shown in FIGS. 1A and 3A, site 100 includes resilient aperture 108 in planar body 102, where aperture 108 (for example, an opening that extends through planar body 102 or an opening in planar body 102 that does not extend through planar body 102) is shaped to receive semiconductor chip 104. As further shown in FIGS. 1A and 3A, site 100 comprises resilient, elongated springs 140 and 142 that are attached at each end to planar body 102. As shown in FIGS. 1A and 3A, elongated springs 140 and 142 extend across aperture 108. In accordance with one or more embodiments, a spring is a resilient element that acts in a plane of planar body 102 to position and retain a microelectronic device in place in the carrier as described below. In accordance with one or more such embodiments, springs 140 and 142 are attached at each end so that springs 140 and 142 may be flexed in a direction away from a center of aperture 108. Springs 140 and 142 are movable in a plane, for example, in the plane of planar body 102, so as to increase the area enclosed by aperture 108. As further shown in FIGS. 1A and 3A, flat hooks 130 and 132 (flat hooks 130 and 132 are also referred to herein as engagement features) are attached to springs 140 and 142 and extend into further apertures in planar body 102 that extend behind rests 134 and 136 (rests 134 and 136 are also referred to herein as fixed features), respectively. In accordance with one or more embodiments, hooks 130 and 132 are attached at the midpoint of springs 140 and 142, respectively.

As shown in FIGS. 1A and 3A, springs 140 and 142 are flexed outwardly, i.e., away from aperture 108, by a rotation of cams 120 and 122 that acts to separate, or further separate, hooks 130 and 132 from rests 134 and 136, respectively. As further shown in FIGS. 1A and 3A, in accordance with one or more embodiments, bosses 116 and 118 attached to springs 140 and 142, respectively, (bosses 116 and 118 are protrusions that form part of an edge of springs 140 and 142, respectively) are moved away from device 104 by such rotation of cams 120 and 122, respectively, to "open" aperture 108. As shown in FIGS. 1A and 3A, when aperture 108 is open, chip 104 may be inserted into (or taken out of) aperture 108 between bosses 110, 112, 114, 116 and 118 that are juxtaposed to respective edges of chip 104. As used herein, a cam is a mechanical element used to urge hooks 130 and 132 apart from rests 134 and 136, respectively, thereby opening aperture 108 in the carrier.

One of ordinary skill in the art can readily appreciate that: (a) lateral boss 116 disposed on an edge of the body of spring 140 represents a portion of an edge of the body of spring 140; (b) lateral boss 118 disposed on an edge of the body of spring 142 represents a portion of an edge of the body of spring 142; (c) lateral boss 110 disposed on an edge of a wall of aperture 108 represents a portion (for example, a fixed portion) of an edge of the wall of aperture 108; and (d) lateral bosses 112 and 114 disposed on an edge of a second wall of aperture 108 represent a portion (for example, a fixed portion) of an edge of the second wall of aperture 108.

As further shown in FIGS. 1B and 3B, in accordance with one or more such embodiments, a rotation of cams 120 and 122 that allows springs 140 and 140 to relax resiliently toward a center of aperture 108 causes the area enclosed by aperture 108 to decrease. As a result, device 104 is held precisely within aperture 108 by boss 116 urging against an edge of device 104 which, in turn, urges an opposing edge of device 104 against fixed boss 110; and by boss 118 urging against an edge of device 104 which, in turn, urges an opposing edge of device 104 against fixed bosses 112 and 114—thereby holding device 104 accurately in aperture 108. The fixed positions of the three bosses 110, 112 and 114 urging against two edges of device 104 determine the position of chip 104 within the plane of planar body 102.

One of ordinary skill in the art should appreciate that further embodiments may be fabricated where springs 140 and 142 do not have lateral bosses or where springs 140 and 142 have more than one lateral boss, or that the one or more lateral bosses are resilient, for example without limitation, resilient flat springs. In addition, one of ordinary skill in the art should also appreciate that further embodiments may be fabricated wherein one or more walls of aperture 108 do not have lateral bosses or where one or more walls of aperture 108 have one lateral boss or have more than two lateral bosses, or that the one or more lateral bosses are resilient, for example without limitation, resilient flat springs.

In accordance with one or more embodiments, planar body 102 may be made of a sheet of full hardness tempered 301 stainless steel having, for example and without limitation, a thickness of 0.25 mm. In accordance with one or more such embodiments, the features of site 100 shown in FIGS. 1A-1B and 3A-3B and described above may be laser cut in a full hardness tempered 301 stainless steel sheet to an accuracy of +/−2 micrometers; springs 140 and 142 may be approximately 0.5 mm wide; springs 140 and 142 may be further divided longitudinally into an array of parallel springs; and planar body 102 may be coated with a thin dielectric film, for example and without limitation, of e-coat, electrodeposited coating that is available from "Pittsburgh Plate Glass," i.e., PPG Industries, Inc. of Pittsburgh, Pa. In accordance with one or more embodiments, a carrier may comprise one or more sites like site 100 that are arranged in an array on planar body 102. As used herein, an array is an ordered assembly of sites positioned, for example and without limitation, for testing purposes. In accordance with one or more alternative embodiments, carrier body 102 may be made of a material such as, for example and without limitation, stainless steel, tempered steel, Monel 500, glass fiber reinforced polyimide, Aramid fiber reinforced polyimide (available from Arlon, Inc. of Santa Ana, Calif.), NiTi shape memory alloy (available from National Electronic Alloys, Inc. of Santa Ana, Calif.), carbon fiber reinforced polymer, or a resilient plastic material.

In accordance with one or more embodiments, cams 120 and 122 may be formed from: (a) an elliptical stainless steel cylinder, for example and without limitation, having a major diameter of 1.25 mm and a minor diameter of 0.5 mm, (b) a stainless steel cylinder having, for example and without limitation, a diameter of 1.25 mm by flattening it on two sides to form flat faces. To insert cams 120 and 122 between hooks 130 and 132 and rests 134 and 136, respectively, cams 120 and 122 are first oriented so that their major axes are oriented along the long direction of the respective springs 140 and 142. In accordance with one or more embodiments, site 100 is opened by rotating cams 120 and 122 by 90° from the cam orientation shown in FIGS. 1B and 3B to the cam orientation shown in FIGS. 1A and 3A. While rotational motion of cams 120 and 122 is preferred, other cam motions are useful for opening apertures in a carrier fabricated in accordance with one or more embodiments. In particular, any one of a number of mechanisms would be useful where the mechanism, in a first position or orientation, moves hooks 130 and 132 away from rests 134 and 136, respectively, to place aperture 108 is in an open configuration, and, in a second position or orientation, allows hooks 130 and 132 to relax towards rests 134 and 136 to place aperture 108 in a closed configuration. For example and without limitation, instead of a mechanism being comprised of rotating cams, a further mechanism may be comprised of pins which are inserted between hooks 130 and 132 and rests 134 and 136, respectively, and which pins are movable away from or towards rests 134 and 136, respectively, so as to cause hooks 130 and 132 to move apart from or towards rests 134 and 136, respectively. As a further example, a still further mechanism may be comprised of wedges which are inserted between hooks 130 and 132 and rests 134 and 136, respectively, and which wedges are movable along rests 134 and 136, respectively, so as to cause hooks 130 and 132 to move apart from or towards rests 134 and 136, respectively.

In accordance with one or more embodiments, aperture 108 may extend through planar body 102, thereby allowing access to a top surface of chip 104 for direct chip cooling, while allowing access to a bottom surface of chip 104 for connection to contactor probes of a test socket. Alternatively, aperture 108 may have a bottom structure so that chip 104 is prevented from falling downward and out of aperture 108 when aperture 108 is opened. In accordance with one or more embodiments, the bottom structure may comprise tabs or a sheet of material with or without apertures therein. In accordance with one or more such embodiments, the bottom structure comprises a thin sheet of copper, copper alloy, steel, polyimide, or other suitable material. In accordance with yet further embodiments, the bottom structure comprises a thin sheet with embedded contactors disposed through the sheet whereby electrical connections may be made between terminals on bottom side of chip 104 and corresponding terminals of a mating socket. Embedded contactors include without limitation terminals with roughened surfaces, spring probes, resilient metal vias, cantilever probes, buckling beam probes, flat spring probes, and the like.

Figure 2:
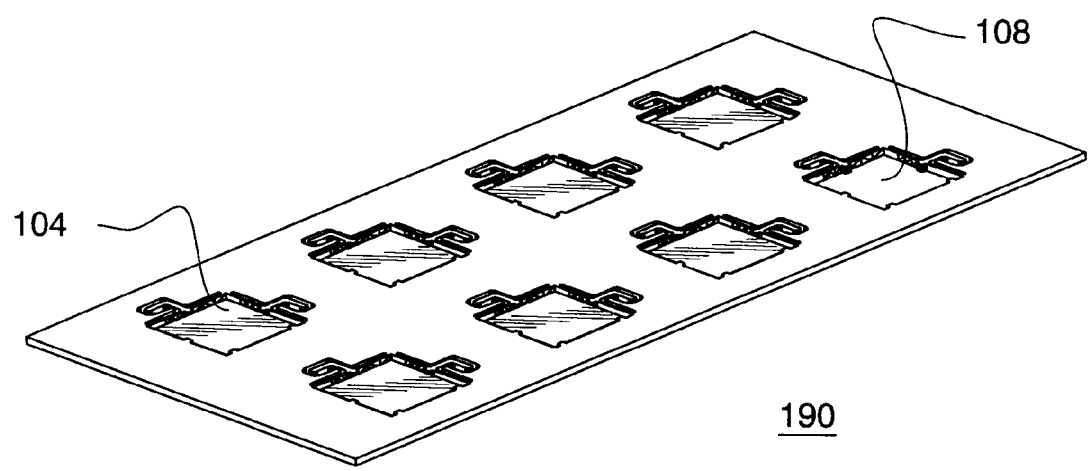
FIG. 2 is a perspective view of a carrier for holding microelectronic devices that is fabricated in accordance with one or more embodiments, the carrier being shown with devices in each position but one.

FIG. 2 is a perspective view of carrier 190 for holding a plurality of devices 104 that is fabricated in accordance with one or more embodiments. As shown in FIG. 2, a plurality of apertures may be disposed in an array on carrier 190 where aperture 108 has been described above in conjunction with FIGS. 1A, 1B, 3A and 3B. For clarity of exposition, numerical labeling of the elements of each site aperture 104 is omitted as having been defined in FIG. 1A. In addition to an array of site apertures 104, carrier 190 may include alignment features (not shown) that may be used to align carrier 190 to a mating element such as, for example and without limitation, a test socket, a burn-in socket, or a processing head.

While carrier 190 (which is fabricated to have a multiplicity of sites like site 108 shown in FIG. 1A) is substantially planar, it will be understood by one of ordinary skill in the art that carriers fabricated in accordance with one or more embodiments may include additional features that facilitate loading and unloading of various types of microelectronic devices. By way of example and not limitation, a beveled frame may be added to planar body 102 to guide devices into apertures like apertures 108. In accordance with one or more such embodiments, the beveled frame may be formed individually, i.e., with one frame per site, or beveled frames may be formed in an array that is attached to planar body 102. As used herein, a frame may be a "picture frame," typically fabricated from molded plastic material, which frame is used to guide a device into an aperture in the carrier. In accordance with one or more such embodiments, a beveled frame may be fabricated using any one of a number of conventionally practiced methods of plastic molding. Suitable plastics for fabricating beveled frames include, for example and without limitation, FR-4 epoxy, liquid crystal polymer, polyether ether ketone (PEEK), polyether sulfone (PES), and polyamideimide (Torlon® available from Quadrant Engineering Plastics of Reading, Pa.).

Further, in accordance with one or more further embodiments, body 102 of a carrier may be stamped, or otherwise formed, to include alignment features, orientation features, stops, stacking elements, bottom stops and the like, that facilitate the use of carriers across a wide spectrum of applications. In addition, and in accordance with one or more embodiments, the thickness of body 102 may be adapted to the devices being held in the carrier (note that in accordance with various embodiments, at some or all sites, the device may be thicker than the body, and in accordance with other embodiments, the body may be thicker than the device). For example and without limitation, the thickness of the body may range from a thin sheet of about 0.1 mm in thickness for use in a flip chip application to a molded plastic sheet of about 5 mm in thickness for use with a MEMS pressure sensor device.

Figure 4A:
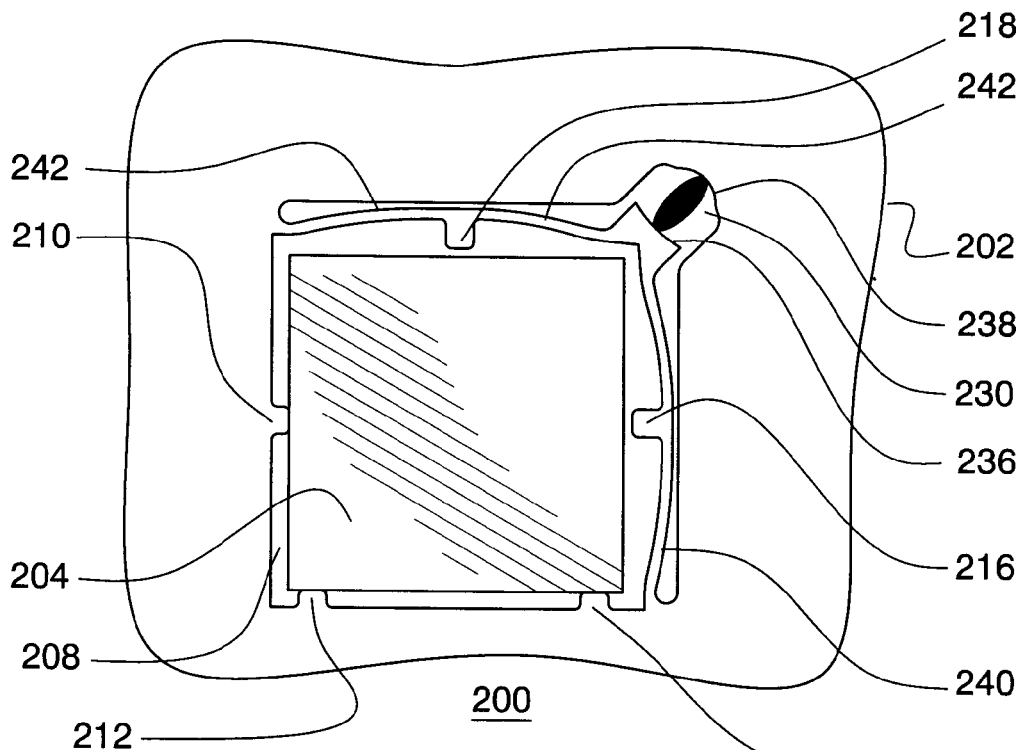
FIGS. 4A and 4B are top views of a site in a carrier for holding microelectronic devices that is fabricated in accordance with one or more further embodiments, the site being shown in an open configuration and in a closed configuration, respectively.

FIG. 4A is a top view of site 200 in a carrier that is fabricated in accordance with one or more embodiments where site 200 is shown in an open configuration allowing chip 204 to be placed in or removed from site 200. As shown in FIG. 4A, site 200 includes resilient aperture 208 in planar body 202 where aperture 208 (for example, an opening that extends through planar body 202 or an opening in planar body 202 that does not extend through planar body 202) is shaped to receive semiconductor chip 204. As further shown in FIG. 4A, in accordance with one or more such embodiments, site 200 comprises resilient, elongated springs 240 and 242 that are attached at one end to planar body 202 and at another end they are attached to each other. In accordance with one or more embodiments, a spring is a resilient element that acts in a plane of planar body 202 to position and retain a microelectronic device in place in the carrier as described below. As further shown in FIG. 4A, edge 236 is formed by the attachment of springs 240 and 242 (edge 236 is also referred to herein as an engagement feature), and edge 236 is disposed outside of aperture 208, where aperture 208 is bounded by inner walls of springs 240 and 242 and the two fixed walls shown in FIG. 4A. As further shown in FIG. 4A, site 200 further comprises a cavity disposed outside aperture 108, the cavity having a rear edge 238 (rear edge 238 is also referred to herein as a fixed feature) disposed opposite edge 236. Springs 240 and 242 are movable by flexing in the plane of planar body 202, thereby increasing the area of aperture 208.

As further shown in FIG. 4A, cam 230 is inserted between opposing edges 238 and 236 (i.e., actuating edges). Aperture 208 is "opened" by actuation of cam 230 (for example, by rotation of cam 230) as shown in FIG. 4A, so that cam 230 urges edge 236 apart from edge 238 and toward a center of aperture 208, thereby distending springs 240 and 242 (i.e., springs 240 and 242 are flexed outwardly, away from aperture 208) and increasing the area enclosed by aperture 208. In accordance with one or more embodiments, bosses 216 and 218 attached to springs 240 and 242, respectively, (bosses 216 and 218 are protrusions that form a part of an edge of springs 240 and 242, respectively) are moved away from edges of device 204 by rotation of cam 230 to "open" aperture 208. As shown in FIG. 4A, in the distended state, when aperture 208 is open, chip 204 may be inserted into (or taken out of) aperture 208 between bosses 210, 212, 214, 216 and 218 that are juxtaposed to respective edges of chip 204.

One of ordinary skill in the art can readily appreciate that: (a) lateral boss 216 disposed on an edge of the body of spring 240 represents a portion of an edge of the body of spring 240; (b) lateral boss 218 disposed on an edge of the body of spring 242 represents a portion of an edge of the body of spring 242; (c) lateral boss 210 disposed on an edge of a wall of aperture 208 represents a fixed portion of an edge of the wall of aperture 208; and (d) lateral bosses 212 and 214 disposed on an edge of a second wall of aperture 208 represent a fixed portion of an edge of the second wall of aperture 208.

Figure 4B:
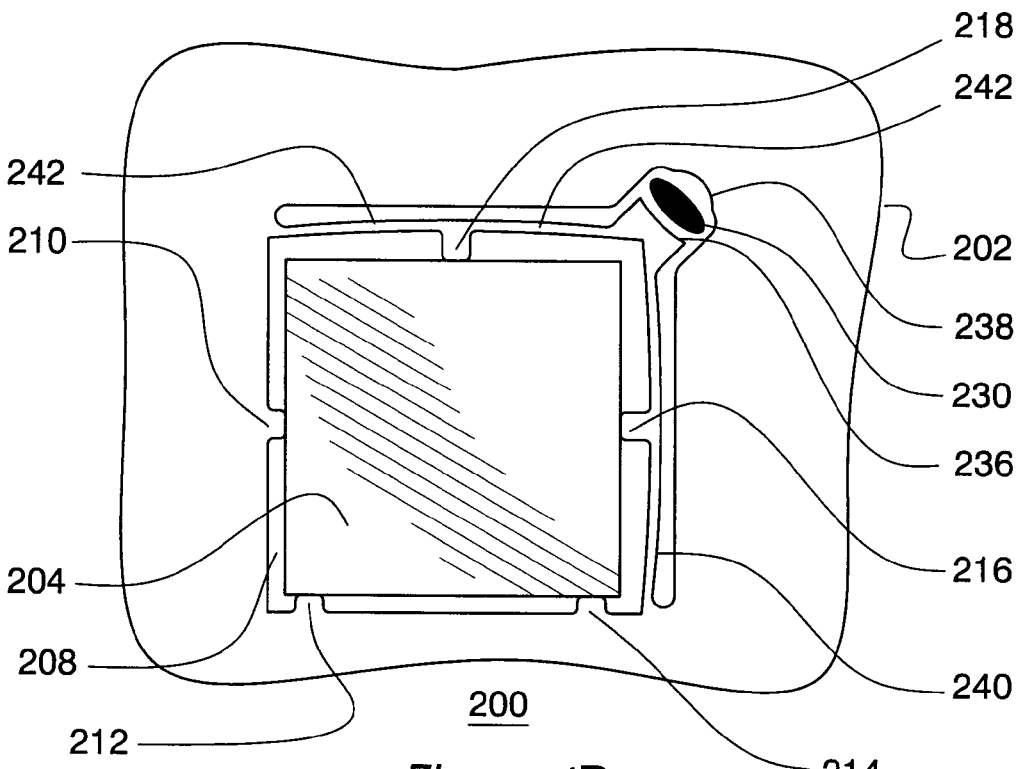

As shown in FIG. 4B, in accordance with one or more such embodiments, rotation of cam 230 (for example, by 90 degrees from the position shown in FIG. 4A) allows edge 236 to move toward edge 238 and, thereby, relax distention of resilient springs 240 and 242. As a result, lateral bosses 216 and 218 relax toward the center of aperture 208 and urge against corresponding edges of device 204, thereby holding device 204 between lateral boss 218 and fixed opposing bosses 212 and 214; and between lateral boss 216 and opposing fixed boss 210. While rotational motion of cam 230 has been described above, other cam motions are useful for opening apertures in a carrier fabricated in accordance with one or more such embodiments. In particular, any one of a number of mechanisms would be useful where the mechanism, in a first position or orientation, moves edge 236 away from edge 238 to place aperture 208 is in an open configuration, and, in a second position or orientation, allows edge 236 to relax towards edge 238 to place aperture 208 in a closed configuration.

As one of ordinary skill in the art can readily appreciate, springs 240 and 242 substantially restrain movement of lateral bosses 216 and 218, respectively, in a direction perpendicular to the plane of site 200. Notwithstanding the movable restraint of bosses 216 and 218 provided by springs 240 and 242, respectively, in accordance with one or more embodiments, bosses 216 and 218 may be moved away from the center of the aperture by motion of cam 230 urging upon opposing edges 236 and 238, thereby opening aperture 208 of site 200.

One of ordinary skill in the art should appreciate that further embodiments may be fabricated where springs 240 and 242 do not have lateral bosses or where springs 240 and 242 have more than one lateral boss, or that the one or more lateral bosses are resilient, for example without limitation, resilient flat springs. In addition, one of ordinary skill in the art should also appreciate that further embodiments may be fabricated wherein one or more walls of aperture 108 do not have lateral bosses or where one or more walls of aperture 208 have one lateral boss or have more than two lateral bosses. Further planar body 202, along with its sites like site 200, may be fabricated in the manner described above with respect to planar body 102 and site 100. Still further, cam 230 may be fabricated in the manner described above with respect to cams 120 and 122.

In accordance with one or more embodiments, aperture 208 may extend through planar body 202, thereby allowing access to a top surface of chip 204 for direct chip cooling, while allowing access to a bottom surface of chip 204 for connection to contactor probes of a test socket.

In further accordance with one or more further embodiments, body 202 of a carrier may be stamped, or otherwise formed, to include alignment features, orientation features, stops, stacking elements, bottom stops and the like, that facilitate the use of carriers across a wide spectrum of applications (see further description below). In addition, and in accordance with one or more embodiments, the thickness of body 202 may be adapted to the devices being held in the carrier (note that in accordance with various embodiments, at some or all sites, the device may be thicker than the body, and in accordance with other embodiments, the body may be thicker than the device).

Embodiments described above are exemplary. As such, many changes and modifications may be made to the description set forth above by those of ordinary skill in the art while remaining within the scope of the invention. In addition, materials, methods, and mechanisms suitable for fabricating embodiments have been described above by providing specific, non-limiting examples and/or by relying on the knowledge of one of ordinary skill in the art. Materials, methods, and mechanisms suitable for fabricating various embodiments or portions of various embodiments described above have not been repeated, for sake of brevity, wherever it should be well understood by those of ordinary skill in the art that the various embodiments or portions of the various embodiments could be fabricated utilizing the same or similar previously described materials, methods or mechanisms. As such, the scope of the invention should be determined with reference to the appended claims along with their full scope of equivalents.

What is claimed is:

1. A carrier for one or more microelectronic devices comprises:

one or more sites having a resilient aperture thereat, the one or more sites being disposed in a planar body;

wherein:

at least two sides of the aperture are bounded by springs that are resilient in a plane parallel to the planar body;

the aperture is adapted to be opened by flexing the springs so the area of the aperture is increased, whereby a microelectronic device may be inserted into or released from the aperture; and the aperture is adapted to be closed by enabling the springs to relax so the area of the aperture is decreased, whereby the microelectronic device may be held in the aperture.

2. The carrier of claim 1 wherein:

a first side of each resilient aperture is bounded by a first flat spring attached to a first movable engagement feature juxtaposed to a first fixed feature of the planar body;

a second side of each resilient aperture is bounded by a second flat spring attached to a second movable engagement feature juxtaposed to a second fixed feature of the planar body; and openings between the first movable engagement feature and the first fixed feature and between the second movable engagement feature and the second fixed feature are adapted to enable insertion of apparatus between the engagement and fixed features of each of the openings, each of which apparatus is adapted (a) to apply force to the engagement and fixed features to increase separation therebetween, and thereby, to move the springs away from a center of the aperture and (b) to relieve the force so that the springs relax toward the center of the aperture.

3. The carrier of claim 2 wherein each end of the first flat spring is attached to the planar body and each end of the second flat spring is attached to the planar body.

4. The carrier of claim 3 wherein the first engagement feature is a hook attached to the first planar spring near the midpoint of the spring.

5. The carrier of claim 1 wherein:

a first side of each resilient aperture is bounded by a first flat spring attached at a first end to the planar body;

a second side of each resilient aperture is bounded by a second flat spring attached at a first end to the planar body and attached at a second end to a second end of the first spring to form a movable engagement feature juxtaposed to a fixed feature on the planar body;

an opening between the movable engagement feature and the fixed feature is adapted to enable insertion of an apparatus between the engagement and fixed feature, which apparatus is adapted (a) to apply force to the engagement and fixed features to increase separation therebetween, and thereby, to move the springs away from a center of the aperture and (b) to relieve the force so that the springs relax toward the center of the aperture.

6. The carrier of claim 2 wherein the planar body is comprised of a metal.

7. The carrier of claim 6 wherein the metal is stainless steel.

8. The carrier of claim 6 wherein the planar body is coated with a dielectric.

9. The carrier of claim 5 wherein the planar body is comprised of a metal.

10. The carrier of claim 9 wherein the metal is stainless steel.

11. The carrier of claim 10 wherein the body is coated with a dielectric.

12. A method for holding one or more devices in a carrier comprising:

providing a carrier comprising:

(a) a planar body with one or more sites having a resilient aperture thereat;

(b) a first side of each resilient aperture is bounded by a first flat spring attached to a first movable engagement feature juxtaposed to a first fixed feature of the planar body;

(c) a second side of each resilient aperture is bounded by a second flat spring attached to a second movable engagement feature juxtaposed to a second fixed feature of the planar sheet; and (d) openings between the first movable engagement feature and the first fixed feature and between the second movable engagement feature and the second fixed feature are adapted to enable insertion of apparatus between the engagement and fixed features of each of the openings, each of which apparatus is adapted (i) to apply force to the engagement and fixed features to increase separation therebetween, and thereby, to move the springs away from a center of the aperture and (ii) to relieve the force so that the springs relax toward the center of the aperture;

inserting the apparatus into the openings at at least one of the sites;

causing the apparatus to increase separation between the engagement and fixed features thereat, thereby opening the aperture at the site;

inserting a device into the aperture; and causing the apparatus to relieve the force, whereby the flat springs relax to close the aperture.

* * * * *